(12) United States Patent
Shen et al.

(10) Patent No.: US 9,246,504 B2
(45) Date of Patent: Jan. 26, 2016

(54) CIRCUITS AND METHODS FOR IMPLEMENTING A RESIDUE AMPLIFIER

(75) Inventors: Junhua Shen, Cambridge, MA (US); Peter Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/993,293

(22) PCT Filed: Dec. 12, 2011

(86) PCT No.: PCT/US2011/064414
§ 371 (c)(1),
(2), (4) Date: Jan. 29, 2014

(87) PCT Pub. No.: WO2012/079077
PCT Pub. Date: Jun. 14, 2012

(65) Prior Publication Data
US 2014/0132438 A1    May 15, 2014

Related U.S. Application Data

(60) Provisional application No. 61/422,135, filed on Dec. 11, 2010.

(51) Int. Cl.
*H03M 1/12* (2006.01)
*H03M 1/44* (2006.01)
*H03M 1/16* (2006.01)

(52) U.S. Cl.
CPC .............. *H03M 1/12* (2013.01); *H03M 1/164* (2013.01); *H03M 1/442* (2013.01)

(58) Field of Classification Search
CPC ......... H03M 1/12; H03M 1/44; H03M 1/442; H03M 1/447; H03M 1/164
USPC .......................... 341/110, 161, 162, 163, 172
See application file for complete search history.

(56) References Cited

U.S. PATENT DOCUMENTS 7,245,245 B2 * 7/2007 Chien ........................... 341/120
7,450,041 B2 * 11/2008 Lin et al. ....................... 341/118
7,479,915 B1   1/2009 Singh et al.

(Continued)

FOREIGN PATENT DOCUMENTS

WO    WO2008109107    11/2008

OTHER PUBLICATIONS

Ahemd, I. et al., A Low-Power Capacitive Charge Pump Based Pipelined ADC IEEE Journal of Solid-State Circuits, vol. 45, No. 5, May 2010.*

(Continued)

*Primary Examiner* — Howard Williams
(74) *Attorney, Agent, or Firm* — Byrne Poh LLP

(57) ABSTRACT

Circuits and methods for implementing a residue amplifier are provided. In some embodiments, circuits for implementing a residue amplifier are provided, the circuits comprising: a first capacitor configured to be charged to an input voltage level and that discharges from the input voltage level to a reference voltage level; a comparator having a first input coupled to the first capacitor, a second input coupled to a reference voltage source, and an output that indicates when the charge on the first capacitor is above the reference voltage level; and a second capacitor configured to be charged to an output voltage based on the output of the comparator.

24 Claims, 20 Drawing Sheets

(a)

(b)

(56) References Cited

U.S. PATENT DOCUMENTS

| 8,547,271 | B2* | 10/2013 | De Geronimo et al. | 341/161 |
|---|---|---|---|---|
| 2006/0208938 | A1* | 9/2006 | Fiorenza et al. | 341/172 |
| 2008/0186077 | A1* | 8/2008 | Guyton et al. | 327/337 |
| 2009/0128389 | A1 | 5/2009 | Bailey et al. | |
| 2010/0176979 | A1 | 7/2010 | Hurrell et al. | |

OTHER PUBLICATIONS

Brooks, L. et al., A Zero-Crossing-Based 8-bit 200 MS/s Pipelined ADC, IEEE Journal of Solid-State Circuits, vol. 42, No. 12, Dec. 2007.*

Fiorenza, J. et al., Comparator-Based Switched-Capacitor Circuits for Scaled CMOS Technologies, IEEE Journal of Solid-State Circuits, vol. 41, No. 12, Dec. 2006.*

Rajaee, O. et al., Time-Shifted CDS Enhancement of Comparator-Based MDAC for Pipelined ADC Applications, 14th IEEE International Conference on Electronics, Circuits and Systems, 2007. ICECS 2007, Dec. 2007.*

Ahmed, I. et al., "A 50MS/s 9.9mW pipelined ADC with 58dB SNDR in 0.18µm CMOS using capacitive charge-pumps", In Proceedings of International Solid-State Circuits Conference, San Francisco, CA, United States, Feb. 8-12, 2009, pp. 164-165a.

Anthony, M., et al., " A process-scalable lower-power charge-domain 13-bit pipline ADC," In Proceedings of IEEE Symposium on VLSI Circuits, Honolulu, HI, United States, Jun. 18-20, 2008, pp. 222-223.

Brooks, L. And Hae-Seung, L., "A Zero-Crossing-Based 8-bit 200 MS/s Pipelined ADC," IEEE Journal of Solid-State Circuits, vol. 42 No. 12, Dec. 2007, pp. 2677-2687.

E. Sackinger and W. Guggenbuhl, "A versatile building block: the CMOS differential difference amplifier," in IEEE Journal of Solid-State Circuits, vol. 22, No. 2, pp. 287-294, Apr. 1987.

Hu, J. et al., "A 9.4-bit, 50-MS/s, 1.44-mW Pipelined ADC Using Dynamic Source Follower Residue Amplification," in IEEE Journal of Solid-State Circuits, vol. 44, No. 4, Apr. 2009, pp. 1057-1066.

International Preliminary Report on Patentability dated Jun. 20, 2013 in International Patent Application No. PCT/US2011/064414.

International Search Report dated Apr. 2, 2015 in International Patent Application No. PCT/US11/64414.

Karanicolas, a. et al., "A 15-b 1-Msample/s digitally self-calibrated pipeline ADC", in IEEE Journal of Solid-State Circuits, vol. 28, No. 12, Dec. 1993, pp. 1207-1215.

Lewis, S., et al., "A 10-b 20-Msample/s analog-to-digital converter," in IEEE Journal of Solid State Circuits, vol. 27, No. 3, Mar. 1992, pp. 351-358.

Maxim Integrated, "Understanding Pipelined ADCs", Oct. 2, 2001, pp. 1-10, available at: http://www.maximintegrated.com/en/app-notes/index.mvp/id/1023.

Murmann, B., "Limits on ADC Power Dissipation", in Analog Circuit Design, Springer, Mar. 2006, pp. 351-367.

Ryu, S. et al., "A 10-bit 50-MS/s Piplined ADC With Opamp Current Reuse," in IEEE Journal of Solid-State Circuits, vol. 42, No. 3, Mar. 2007, pp. 475-485.

Sepke, T. et al., "Comparator-Based Switched-Capacitor Circuits for Scaled CMOS Technologies", In Proceedings of the International Solid-State Circuits Conference, San Francisco, CA, United States, Feb. 6-9, 2006, pp. 812-821.

Shen, J. And Kinget, P., "Current-Charge-Pump Residue Amplification for Ultra-Low Power Pipelined ADCs", in IEEE Transactions on Circuits and Systems II: Express Briefs, vol. 58, No. 7, Jul. 14, 2011, pp. 412-416.

Written Opinion dated Apr. 4, 2012 in International Patent Application No. PCT/US11/64414.

* cited by examiner

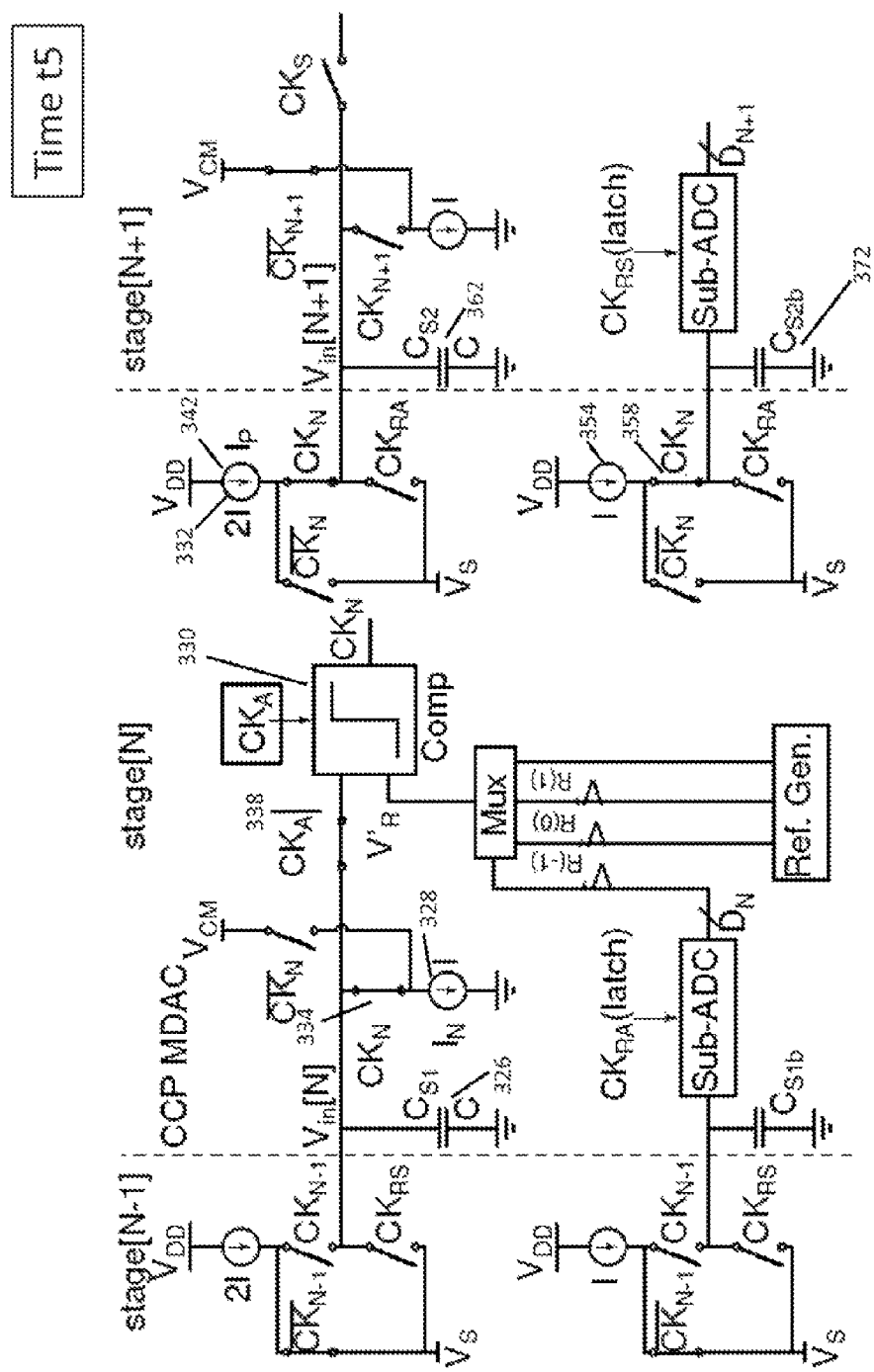

CIRCUITS AND METHODS FOR IMPLEMENTING A RESIDUE AMPLIFIER

CROSS REFERENCE TO RELATED APPLICATION

This application claims the benefit of U.S. Provisional Patent Application No. 61/422,135, filed Dec. 11, 2010, which is hereby incorporated by reference herein in its entirety.

STATEMENT REGARDING GOVERNMENT FUNDED RESEARCH

This invention was made with government support under grant PHY 0612811 awarded by the National Science Foundation. The government has certain rights in the invention.

TECHNICAL FIELD

Circuits and methods for implementing a residue amplifier are provided.

BACKGROUND

Pipelined Analog-to-Digital Converters (ADCs) are widely used in high speed communication systems and other applications. A pipelined ADC converts an analog input signal into a digital output signal by generating bits of the digital output signal in multiple pipelined stages. Each stage in the pipelined ADC performs two functions: (1) producing digital output bits; and (2) computing and amplifying a residue signal to be passed on to the next stage.

In the case of the widely used 1.5 bit/stage pipelined ADC architecture, the computation and amplification of the residue signal, $V_{res}[N+1]$, output by an Nth stage of the pipelined ADC architecture typically implements the operation described in equation (1):

$$V_{res}[N+1] = 2 \cdot \left(V_{res}[N] - b \cdot \frac{V_{REF}}{2}\right) \tag{1}$$

where $V_{REF}$ is the reference voltage, and b is the sub-ADC output coded as $-1, 0,$ or $1$.

Typical mechanisms for an accurate implementation of the 2× gain articulated in equation (1) have not been efficient in terms of power usage.

Accordingly, circuits and methods for implementing a residue amplifier are provided.

SUMMARY

Circuits and methods for implementing a residue amplifier are provided. In some embodiments, circuits for implementing a residue amplifier are provided, the circuits comprising: a first capacitor configured to be charged to an input voltage level and that discharges from the input voltage level to a reference voltage level; a comparator having a first input coupled to the first capacitor, a second input coupled to a reference voltage source, and an output that indicates when the charge on the first capacitor is above the reference voltage level; and a second capacitor configured to be charged to an output voltage based on the output of the comparator.

In some embodiments, methods for implementing a residue amplifier are provided, the methods comprising: charging a first capacitor to an input voltage level and then discharging the first capacitor from the input voltage level to a reference voltage level; comparing the voltage level on the first capacitor to the voltage level from a reference voltage source, and producing an indication when the voltage level on the first capacitor is above the voltage level from the reference voltage source; and charging a second capacitor to an output voltage based on the indication.

BRIEF DESCRIPTION OF THE DRAWINGS

FIGS. 7a-7f are schematics showing configurations of switches of the circuit of FIG. 3 in accordance with some embodiments.

DETAILED DESCRIPTION

Figure 1:
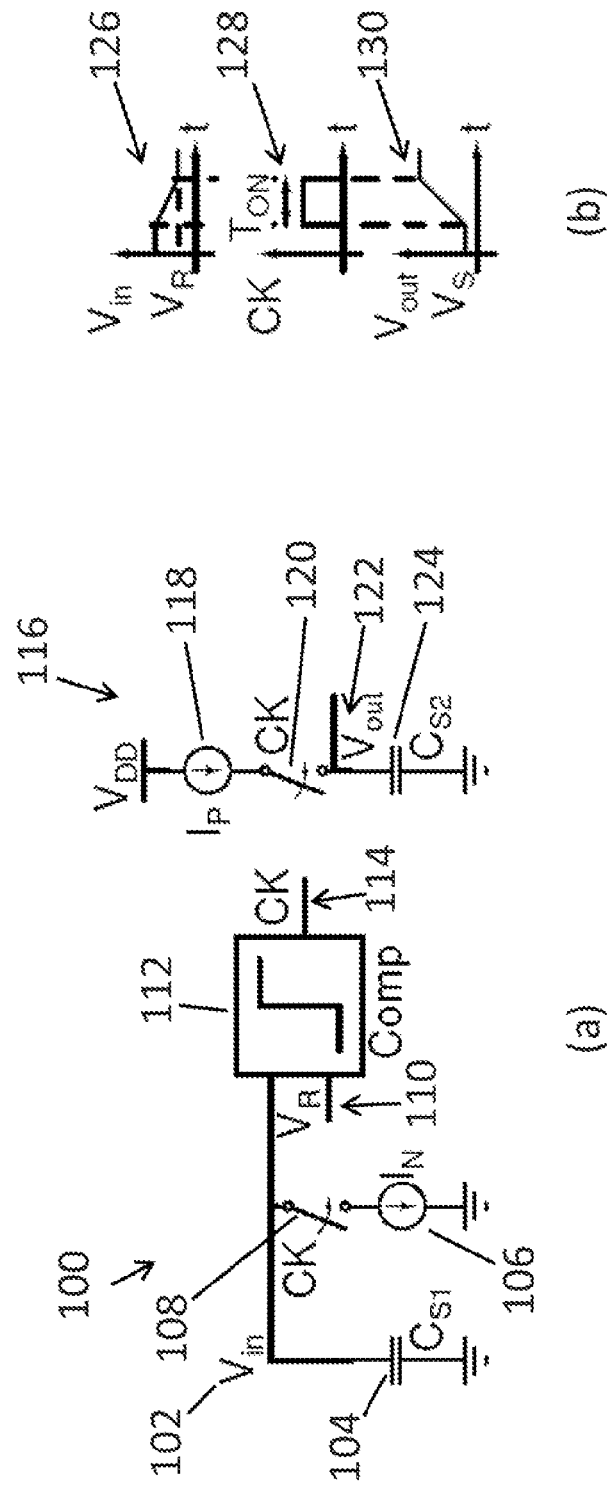
FIGS. 1a and 1b include a block diagram of a current charge pump (CCP) residue amplifier and graphs representing its operation in accordance with some embodiments.

In accordance with some embodiment, circuits and methods for implementing a residue amplifier are provided. In some embodiments, residue amplifiers as described herein can be used to perform residue signal computation and amplification. In some embodiments, residue amplifiers as described herein can be used to perform residue signal computation and amplification in one or more stages of a pipelined ADC or in any other circuit where residue signal computation is needed.

FIG. 1(a) presents a block diagram of a current charge pump (CCP) residue amplifier circuit for residue calculation and amplification in accordance with some embodiments. As shown, the circuit includes an input portion 100 and an output portion 116. Input portion 100 includes an input capacitor $C_{S1}$ 104, a switch 108, a current source $I_N$ 106, and a comparator 112. Output portion 116 includes a current source $1_P$ 118, a switch 120, and an output capacitor $C_{S2}$ 124.

Initially, an input voltage $V_{in}$ 102 is stored on the input capacitor $C_{S1}$ 104. This input. voltage may have been applied to the input capacitor from any suitable source. For example, this input voltage may have been applied to the input capacitor from a voltage being measured from another current charge pump residue amplifier circuit or any other suitable source.

The charge on the input capacitor $C_{S1}$ 104 at the input voltage is shown in graph 126 of FIG. 1(b). As also shown in this graph, a reference voltage $V_R$ 110 is below the input voltage.

In response to the charge on the input capacitor $C_{S1}$ 104 being higher than the reference voltage $V_R$ 110, comparator 112 outputs a HIGH level on output $C_K$ 114. This HIGH level causes switch 108 to close, resulting in the input capacitor being discharged by current source $I_N$ 106.

As illustrated in graph 126, this causes the charge on the capacitor to gradually decrease until it reaches $V_R$. At this point, comparator 112 outputs a LOW level on output $C_K$ 114. This low level causes switch 108 to open and input capacitor 104 to stop discharging.

As illustrated in graph 128 of FIG. 1(b), output CK 114 was at the HIGH level for a period of time $T_{ON}$.

During the period $T_{ON}$, switch 120 in output portion 116 is also closed. This causes output capacitor $C_{S2}$ 124 to be charged by current source $I_P$ 118.

As illustrated in graph 130 of FIG. 1(b), this cause the voltage at $V_{out}$ terminal 122 to rise from an initial level of $V_S$ over period $T_{ON}$.

The period $T_{ON}$ can be related to the input voltage $V_{in}$, the reference voltage $V_R$, the input capacitor $C_{S1}$, and current source $I_N$ 106 as shown in the following equation (2):

$$T_{ON} = \frac{Q}{I_N} = \frac{(V_{in} - V_R)C_{S1}}{I_N} \quad (2)$$

The output voltage $V_{out}$ can be related to the input voltage $V_{in}$, the reference voltage $V_R$, the input capacitor $C_{S1}$, current source $I_N$ 106, the output capacitor $C_{S2}$, the current source $I_P$ 118, and the initial voltage $V_S$ on the output capacitor as shown in the following equation (3):

$$V_{out} = \frac{C_{S1}}{C_{S2}} \frac{I_P}{I_N}(V_{in} - V_R) + V_S \quad (3)$$

The inter-stage gain can be set to 2 by choosing $I_P = 2 \cdot I_N$ and $C_{S1} = C_{S2}$ and by charging $C_{S2}$ at twice the rate of the discharging rate of $C_{S1}$. Thus, with these parameters, the output voltage $V_{out}$ can be represented by the following equation (4):

$$V_{out} = 2(V_{in} - V_R) + V_S \quad (4)$$

Although the residue amplifier illustrated in FIG. 1 is implemented using two current sources 106 and 118, a similar residue amplifier can alternatively be implemented using resistors in place of the current sources. Thus, for example, in such an embodiment, when switch 108 is closed due to a HIGH output from comparator 112, voltage on capacitor 104 will be discharged through a resistor in place of current source 106. While capacitor 104 is discharging, a resistor in the place of current source 118 will charge capacitor 124 via closed switch 120 (also due to the HIGH output from comparator 112). When the voltage level on capacitor 104 reaches the level of the reference voltage, the comparator output will go LOW and cause switches 108 and 120 to open, the discharge of capacitor 104 to stop, and the charging of capacitor 124 to stop. Based on the relative sizes of the capacitors and resistors, the gain of such a residue amplifier can be controlled.

In accordance with some embodiments, the residue amplifier circuits described above can be implemented as part of a stage of a multi-stage pipelined analog-to-digital converter (ADC). For example, in some embodiments, the current charge pump residue amplifier circuit. of FIG. 2 can be implemented in a single-ended 8-bit CCP pipelined ADC with 1.5 bit per stage.

Figure 2:
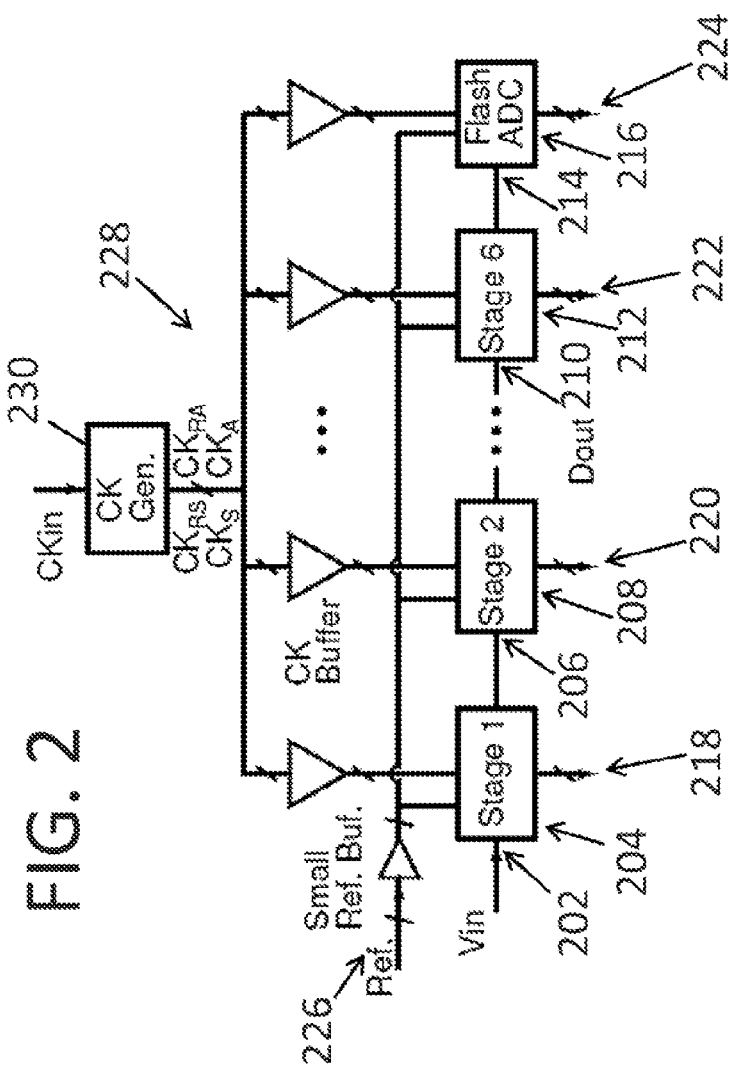
FIG. 2 is a block diagram of a pipelined analog-to-digital converter (ADC) in accordance with some embodiments.

A block diagram of such an ADC 200 in accordance with some embodiments is shown in FIG. 2. As illustrated, an input voltage Vin is received at input 202 to stage 1 204. Stage 1 204 processes this input voltage and produces a residue voltage at input 204 to stage 2 206. Stage 2 206 processes this residue input voltage and produces a residue voltage, This repeats for stages 3, 4, and 5, after which stage 5 produces a residue voltage at input 210 of stage 6 212. Stage 6 212 processes this residue input voltage and produces a residue voltage at input 214 of flash ADC stage 216.

Each of stages 1-6 and flash ADC stage produce output bits (e.g., bits 218, 220, 222, and 224) that can be used as the output of the ADC.

In accordance with some embodiments, a switched-capacitor sampling circuit can be used at the input of the first stage. Any suitable switched-capacitor sampling circuit can be used in some embodiments.

As also shown, the ADC can provide reference voltages 226 and clock signals 228 to the stages of the ADC as described further below.

Figure 3:
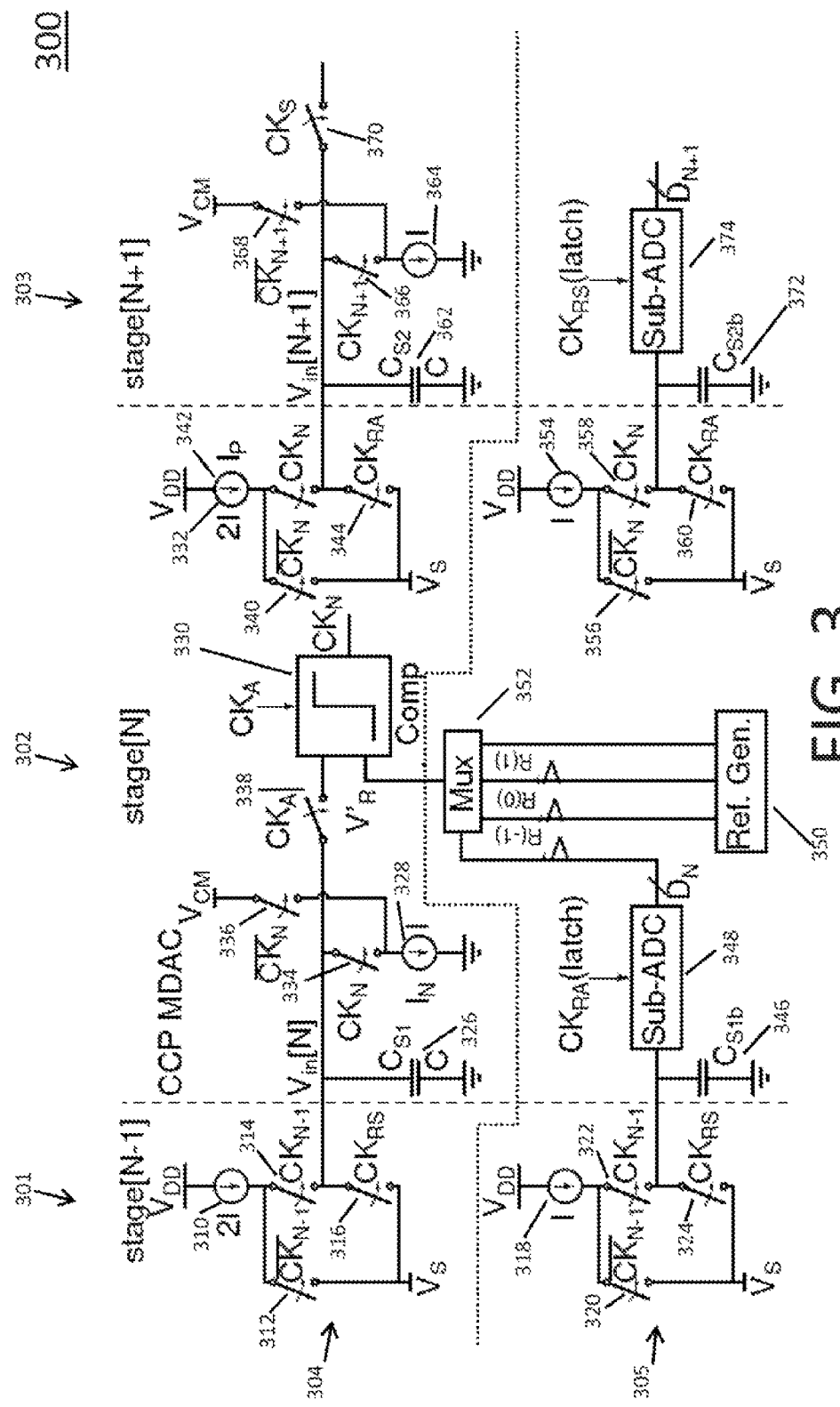
FIG. 3 is a schematic of a portion of a pipelined ADC using a CCP residue amplifier in accordance with some embodiments.

Turning to FIG. 3, in accordance with some embodiments, an example of a portion 300 of a pipelined ADC using CCP residue amplifier circuits as described above is shown. Although a single-ended implementation is shown in FIG. 3 for ease of explanation, a differential version can be implemented in some embodiments, for example as discussed below in connection with FIG. 12.

As shown, portion 300 of the pipelined ADC includes a part of a stage N−1 301, a stage N 302, and a part of a stage N+1 303. As also shown, each of these stages includes a signal path 304 and a sub-ADC path 305.

As illustrated, the part of stage N−1 301 shown in FIG. 3 for the signal path includes a current source 310 and switches 312, 314, and 316. The part of stage N−1 301 for the sub-ADC path includes a current source 318 and switches 320, 322, and 324. Any suitable current sources 310 and 318 and switches 312, 314, 316, 320, 322, and 324 can be used in some embodiments. For example, current sources 310 and 318 can be 30 μA and 15 μA, respectively, that are implemented using regulated, cascoded current sources that avoid pushing their transistors into the linear region, in some embodiments. As another example, switches 312, 314, 316, 320, 322, and 324 can be implemented using MOS transistors or transmission gates (e.g., PMOS and NMOS transistors in parallel) in some embodiments.

Stage N 302 shown in FIG. 3 for the signal path includes input capacitor $C_{S1}$ 326, current source $I_N$ 328, comparator 330, current source $I_P$ 332, and switches 334, 336, 338, 340, 342, and 344. Stage N 302 for the sub-ADC path includes input capacitor $C_{S1b}$ 346, sub-ADC 348, reference generator 350, multiplexer 352, current source 354, and switches 356, 358, and 360. Any suitable input capacitors 326 and 346, current sources 328, 332, and 354, comparator 330, sub-ADC 348, reference generator 350, multiplexer 352, and switches 334, 336, 338, 340, 342, 344, 356, 358, and 360 can be used in some embodiments. For example, capacitors 326 and 346 can be 100 fF and 50 fF, respectively, to meet the kT/C noise requirement and yet also be big enough that parasitic capacitances will not noticeably affect performance, in some embodiments. As another example, current sources 328, 332, and 354 can be 15 μA, 30 μA, and 15 μA, respectively, in some embodiments. As yet another example, reference generator 350 can be any suitable source of three reference voltages and multiplexer 352 can be any suitable device for selecting one of these reference voltages and providing it to comparator 330. As still another example, switches 334, 336, 338, 340, 342, 344, 356, 358, and 360 can be implemented using MOS transistors or transmission gates (e.g., PMOS and NMOS transistors in parallel) in some embodiments.

Stage N+1 303 shown in FIG. 3 for the signal path includes input capacitor $C_{S2}$ 362, current source 364, and switches 366, 368, and 370. Stage N+1 for the sub-ADC path includes input capacitor $C_{S2b}$ 372 and sub-ADC 374. For example, input capacitors 362 and 372 can be 100 fF and 50 fF, respectively, to meet the kT/C noise requirement and yet also be big enough that parasitic capacitances will not noticeably affect performance, in some embodiments. As another example, current source 364 can be 30 μA, in some embodiments. As yet another example, switches 366, 368, and 370 can be implemented using MOS transistors or transmission gates (e.g., PMOS and NMOS transistors in parallel) in some embodiments.

As shown, in some embodiments, by using a second CCP in the sub-ADC path, the input voltage $V_{in}[N]$ can be protected from sub-ADC kickback noise. In some embodiments, this second CCP can be scaled relative to the first CCP in the signal path in order to reduce power consumption. For example, in some embodiments, the size of input capacitor $C_{S1b}$ 346 can be half the size of the input capacitor $C_{S1}$ 326, and the size of the current source 318 feeding capacitor $C_{S1b}$ 346 can be half the size of the current source 310 feeding capacitor $C_{S1}$ 326.

In accordance with some embodiments, to accommodate overshoot due to delay of comparator 330 delay, $V_S$ can be set to 270 mV.

Any suitable voltage levels can be used for $V_{DD}$, $V_{CM}$, and $V_{REF}$ in some embodiments. For example, $V_{DD}$ can be 1V, $V_{CM}$ can be 0.55V, and $V_{REF}$ can be 0.2V in some embodiments.

Figure 4:
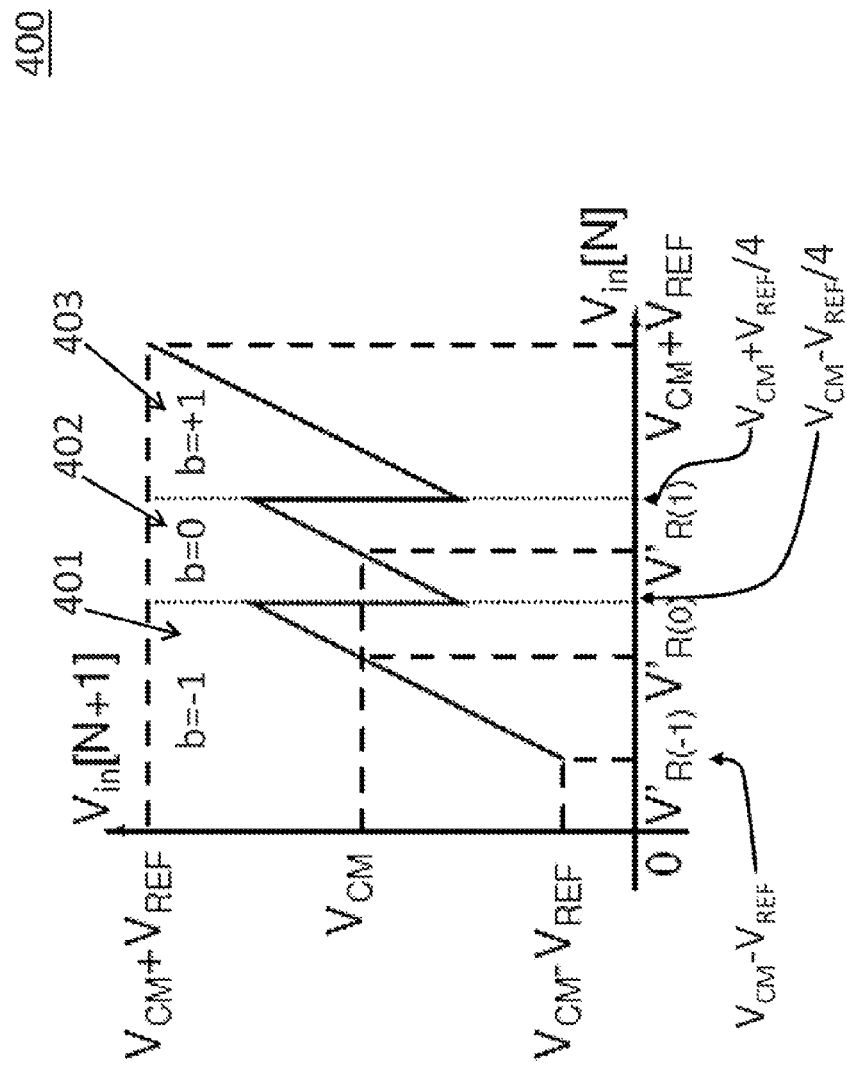
FIG. 4 is a diagram of transfer characteristics of a stage of a pipelined ADC in accordance with some embodiments.

FIG. 4 shows an example 400 of transfer characteristics for stage N 302 of FIG. 3 in accordance with some embodiments. As illustrated, this stage is a 1.5 bit stage, and therefore operates in three modes (b=−1, b=0, and b=1) represented by regions 401, 402, and 403 of FIG. 4.

As also illustrated, input $V_{in}[N]$ and output signal $V_{in}[N+1]$ of the stage lie between $V_{CM}-V_{REF}$ and $V_{CM}+V_{REF}$. Upon re-writing equation (1) based on this characteristic, the operation of the stage becomes:

$$V_{in}[N+1] = 2 \cdot \left(V_{in}[N] - \left\{V_{CM} - (1-b) \cdot \frac{V_{REF}}{2}\right\}\right) + (V_{CM} - V_{REF}) \quad (5)$$

Equation (5) can be implemented with a CCP circuit based on equation (4) by setting $V_S$ to $V_{CM}-V_{REF}$.

As also shown in FIG. 4, for each of the three modes of the stage, $V_{in}[N]$ is initially larger than the reference voltage on the comparator, $V'_{R(b)}=V_{CM}-(1-b)V_{REF}/2$, guaranteeing the correct operation of the CCP circuit stage.

Figure 5:
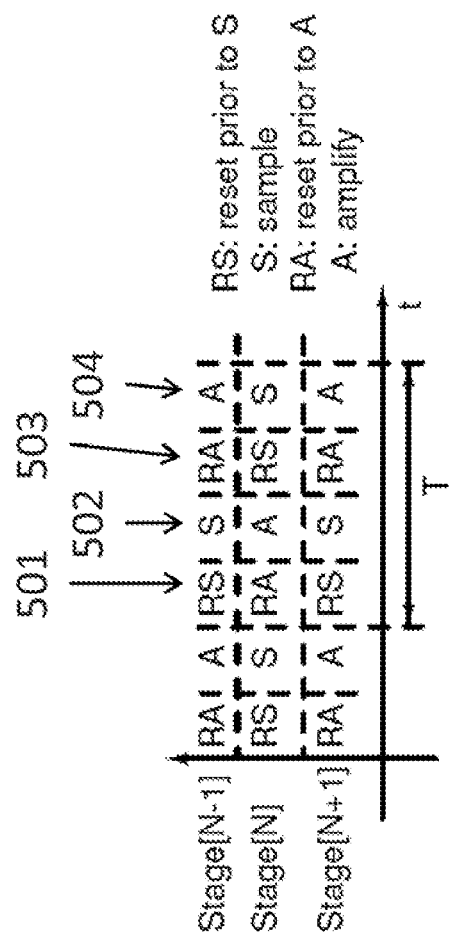
FIG. 5 is a diagram showing phases of opera on of a stage of a pipelined ADC in accordance with some embodiments.

As shown in FIG. 5, stage N of FIG. 3 operates in four clock phases 501, 502, 503, and 504. The first phase 501 is a reset phase that occurs prior to sampling the stage's input. The second phase 502 is a sampling phase for sampling the stage's input. The third phase 503 is a reset phase that occurs prior to amplifying the stage's residue. And the fourth phase 504 is an amplifying phase for amplifying the stage's residue.

Figure 6:
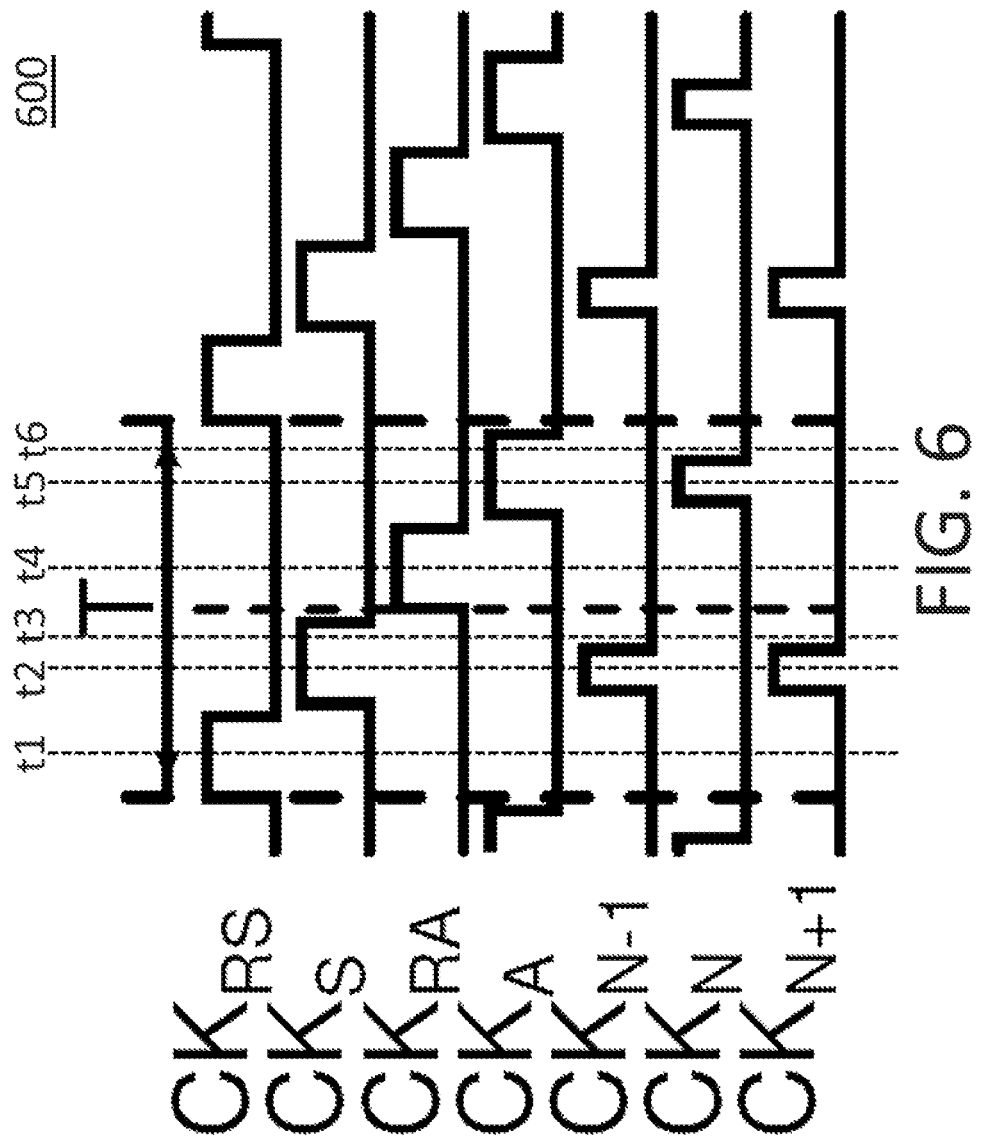
FIG. 6 is a timing diagram that shows clock signals in accordance with some embodiments.

An example of a timing diagram 600 that shows clock signals $CK_{RS}$, $CK_S$, $CK_{RA}$, and $CK_A$ that can be used to control these four phases is presented in FIG. 6. As illustrated, a clock pulse $CK_{RS}$ can be provided to define first phase 501. A clock pulse $CK_S$ can be provided to define second phase 502. A clock pulse $CK_{RA}$ can be provided to define third phase 503. A clock pulse $CK_A$ can be provided to define fourth phase 504.

Also shown in timing diagram are signals $CK_{N-1}$, $CK_N$, and $CK_{N+1}$ that would be generated by the comparators (e.g., comparator 330) of stages N+1 301, N 302, and N+1 303, respectively. As described in connection with FIG. 1, these signals represent the $T_{ON}$ times of the stages.

In accordance with some embodiments, the duty cycle of the reset phases can be made smaller to optimize operating speed. To generate the four clock signals, a divide-by-2 circuit can be employed in the clock generator shown in FIG. 2. in some embodiments, these clock signals can be distributed to each stage with equal delay.

At each of times t2, t2, t3, t4, t5, and t6 shown in FIG. 6, the switches of circuit 400 of FIG. 4 will have a different configuration based on the clock signals $CK_{RS}$, $CK_S$, $CK_{RA}$, and $CK_A$ and signals $CK_{N-1}$, $CK_N$, and $CK_{N+1}$ as described below in connection with FIGS. 7a-7f.

Figure 7A:
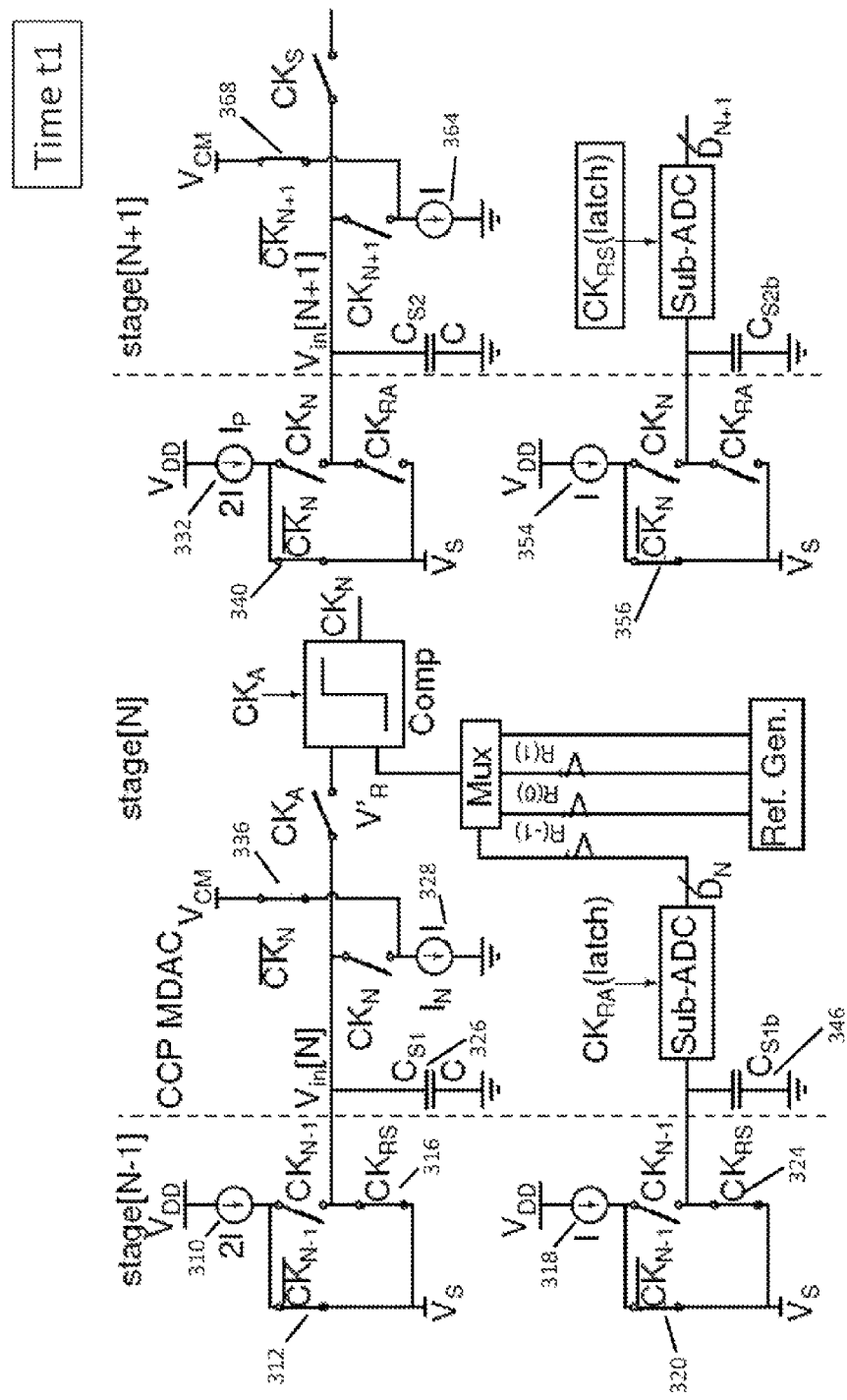

Turning to FIG. 7a, a configuration of switches for time t1 during first phase 501 is shown. As illustrated, during a reset phase in which clock $CK_{RS}$ is HIGH, input capacitor $C_{S1}$ 326 is initialized to $V_S$ by closed switch 316 and input capacitor $C_{S1b}$ 346 is initialized to $V_S$ by closed switch 324.

As also illustrated, in FIG. 7a, in some embodiments, when the current sources are not charging or discharging a capacitor, the current sources can be switched to dummy paths. For example, as shown in FIG. 7a, current sources 310, 318, 328, 332, 354, and 364 can be switched to dummy paths including switches 312, 320, 336, 340, 356, and 368. While costing some additional power, using such dummy paths avoids current source turn-on transients and the associated possibly signal-dependent errors.

Figure 7B:
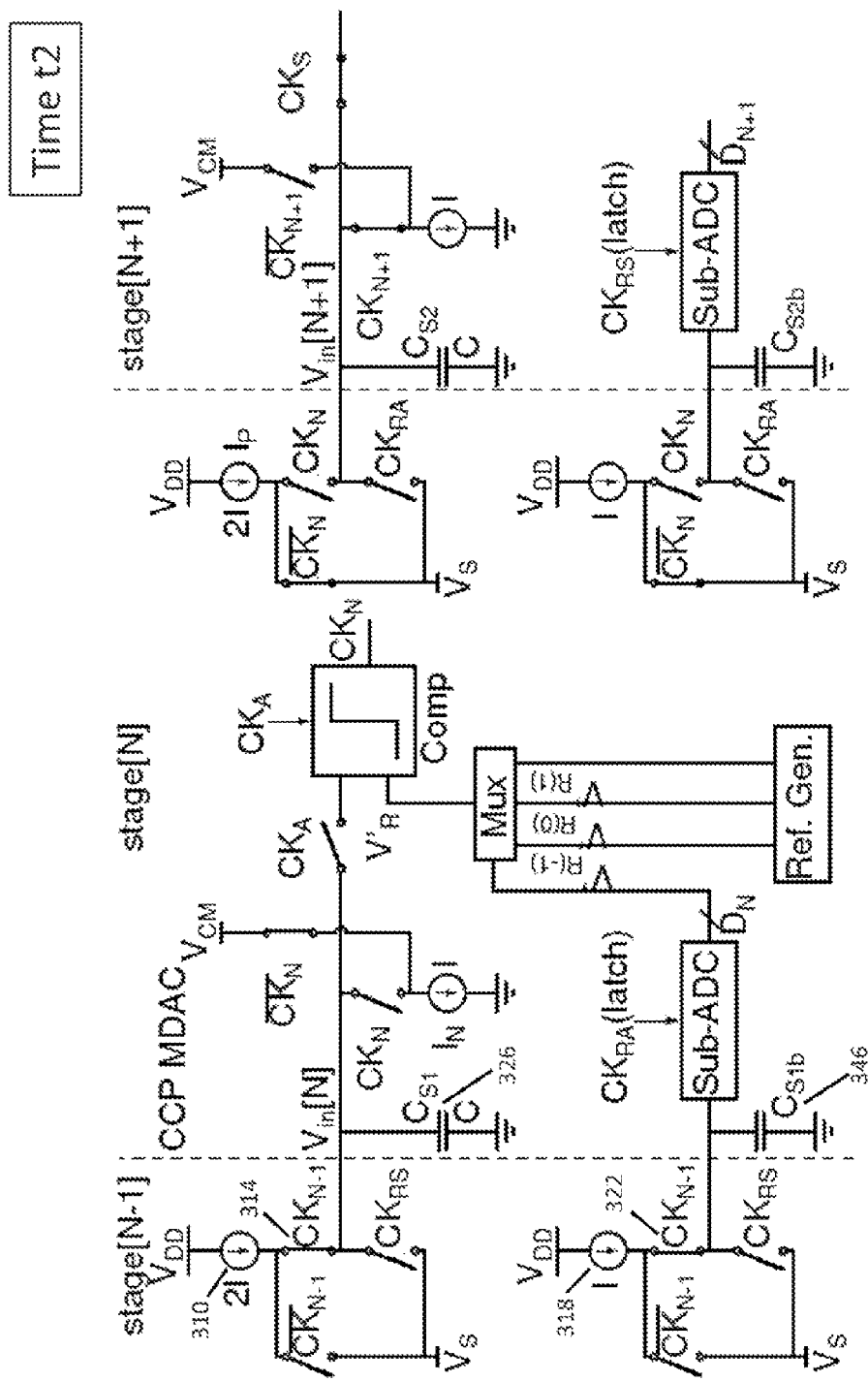

Next, as illustrated in FIG. 7b, during a sampling phase in which clock $CK_S$ is HIGH (as shown at time t2 of FIG. 6), input capacitor $C_{S1}$ 326 is charged to $V_{in}[N]$ by current source 310 via switch 314 and capacitor $C_{S1b}$ is charged by current source 318 via switch 322.

Figure 7C:
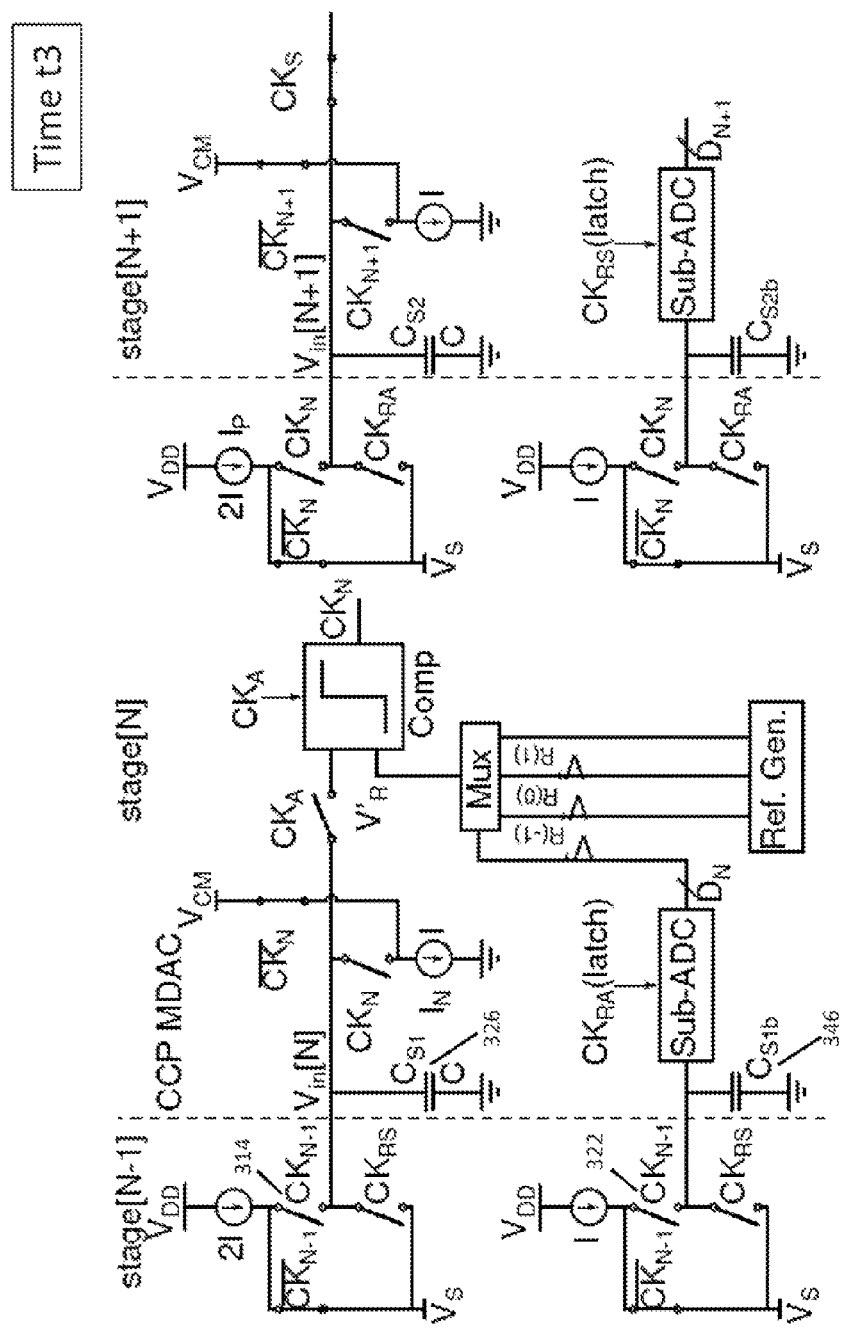

At time t3, as shown in FIG. 7c, the charging of capacitors 326 and 346 is complete and no longer being performed due to open switches 314 and 322.

Figure 7D:
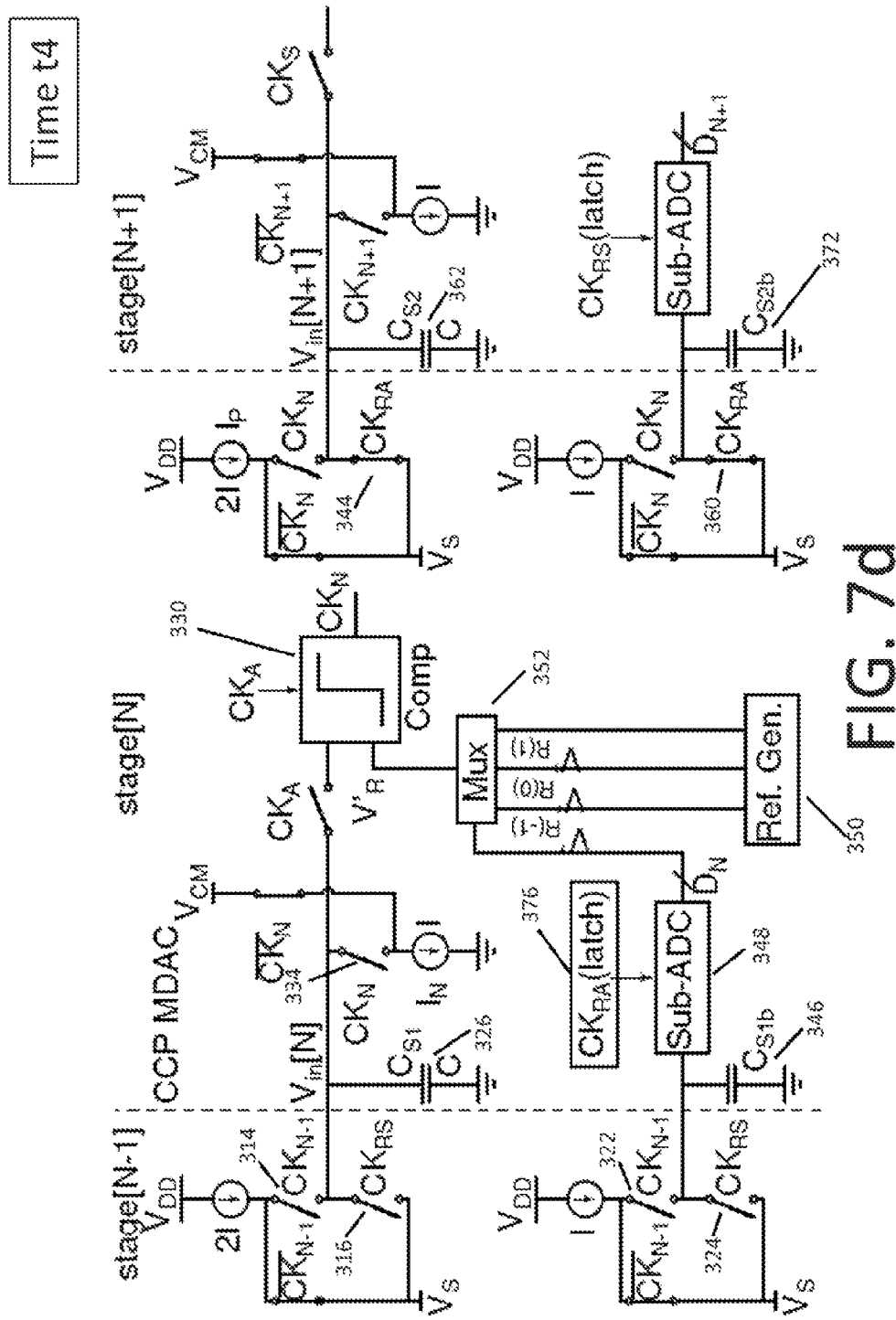

During a reset phase, as shown in FIG. 7d at time t4, capacitor $C_{S2}$ 362 and capacitor $C_{S2b}$ 372 are initialized to $V_S$ by closed switches 344 and 360, respectively. During this time, the voltages on capacitors 326 and 346 are held constant because of open switches 314, 316, and 318 and open switches 322 and 324, respectively. Also, during this time, sub-ADC 348 latches a digital value based on the voltage on capacitor 346 in response to signal 376 and provides that value to multiplexer 352. Multiplexer 352 then selects one of references $V'_{R(-1)}$, $V'_{R(-0)}$, and $V'_{R(+1)}$ from reference generator 350 as reference voltage $V_R'$ and provides this reference voltage to comparator 330 as its threshold.

At time t5, as shown in FIG. 7e, during an amplifying phase, the voltage on capacitor $C_{S1}$ 326 is provided to comparator 330 via capacitor 338. The output of the comparator starts HIGH based on $V_{in}$ being greater than $V_R'$ as shown in 126 of FIG. 1(b). Because switch 334 is closed, the voltage on capacitor $C_{S1}$ 326 decreases over a period $T_{ON}$ due to current source 328 as shown in 126 and 128 of FIG. 1(b). During this time, capacitors $C_{S2}$ 362 and $C_{S2b}$ 372 are charged by current sources 332 and 354 via switches 342 and 358, respectively.

Figure 7F:
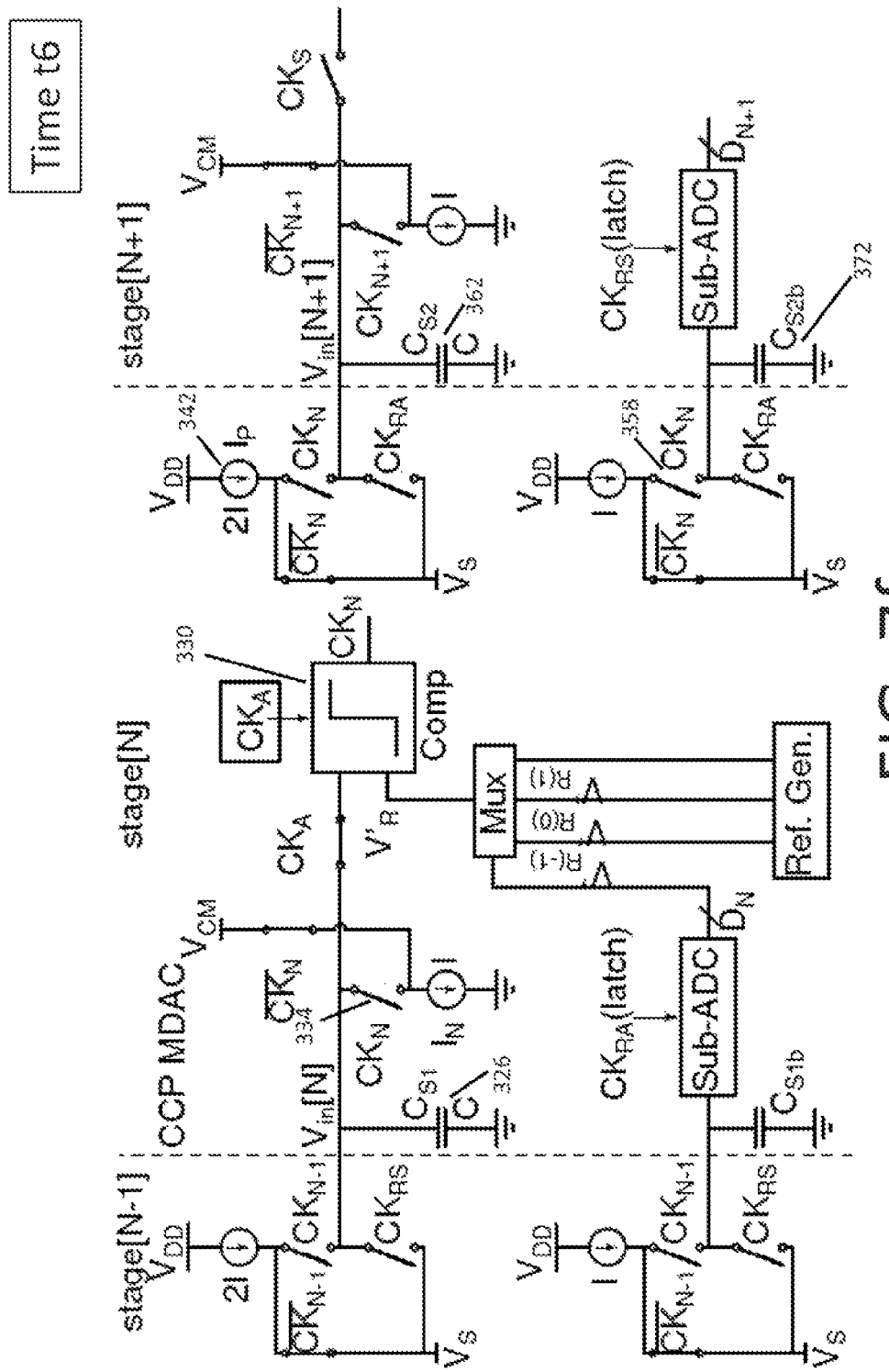

Finally, at time t6, as shown in FIG. 7f, when the voltage on capacitor $C_{S1}$ 326 decreases to $V'_R$, the output on comparator 330 goes causing switch 334 to open and the discharging of capacitor 326 to stop. The output of comparator 330 going LOW also causes switches 342 and 358 to open, thereby causing the charging of capacitors 362 and 372 to stop.

Figure 8:
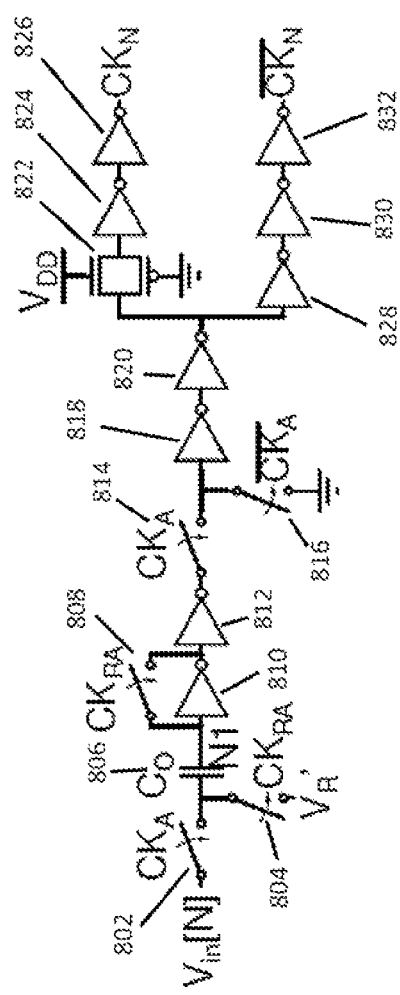
FIG. 8 is a schematic of a signal path comparator in accordance with some embodiments.

FIG. 8 shows an example of a signal path comparator 800 that can be used as signal path comparator 330 of FIG. 3 in accordance with some embodiments. As shown, comparator 800 can include switches 802, 804, 808, 814, and 816, capacitor 806, inverters 810, 812, 818, 820, 824, 826, 828, 830, and 832, and transmission gate 822. Any suitable switches, capacitor, inverters, and transmission gate can be used in some embodiments. For example, switches 802, 804, 808, 814, and 816 can be implemented using MOS transistors or transmission gates (e.g., PMOS and NMOS transistors in parallel) in some embodiments.

Figure 9A:
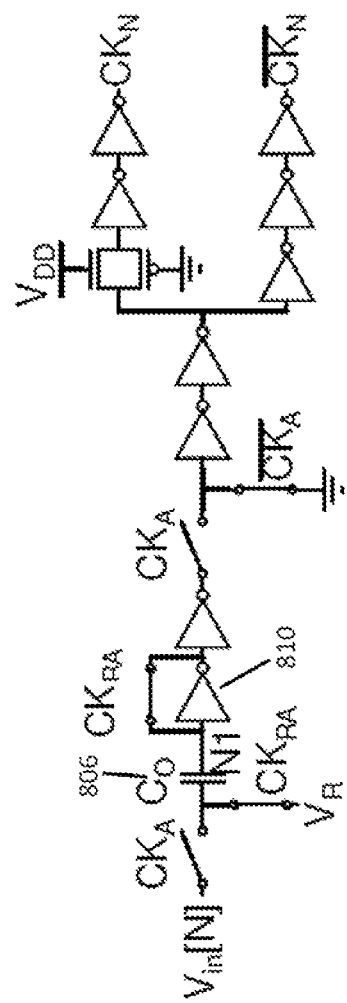
FIGS. 9a and 9b are schematics showing configurations of switches of the circuit of FIG. 8 in accordance with some embodiments.
Figure 9B:
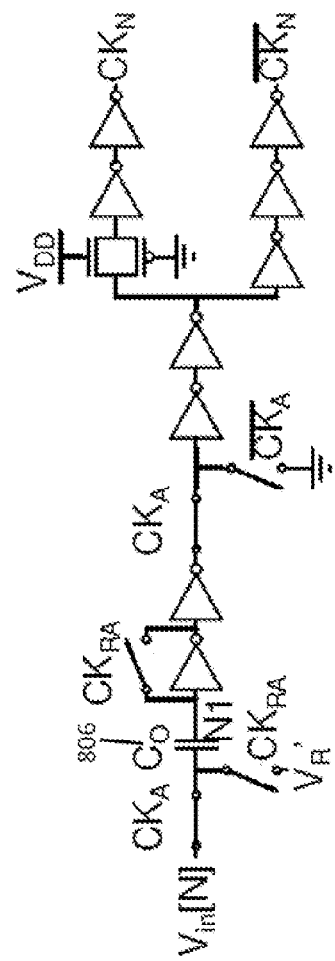

As can be seen in FIG. 8, the switches of comparator 800 are controlled by clock signals $CK_A$ and $CK_{RA}$. FIGS. 9a and 9b show the configuration of the switches during HIGH levels of clock signals $CK_A$ and $CK_{RA}$, respectively.

In some embodiments, an offset cancellation technique for the first inverter 810 can be used. As shown in FIG. 9a, the offset of the first inverter 810 is sampled onto capacitor $C_O$ 806 when clock signal $CK_{RA}$ is HIGH. As shown in FIG. 9b, when the clock signal $CK_{RA}$ is LOW and $CK_A$ is HIGH, the negative offset voltage stored on capacitor $C_O$ 806 is added to the input $V_{in}[N]$. By employing this offset cancellation technique, the threshold of comparator 800 is defined when clock signal $CK_{RA}$ is HIGH and the reference voltage $V_R'$ from multiplexer 352 (FIG. 3) is applied as shown in FIG. 7d.

Also, in some embodiments, the equivalent offset of the signal-path comparator due to its finite delay can be accommodated by towering the initial voltage $V_S$ of the succeeding stage. For example, instead of using a $V_S$ of 350 mV, a $V_S$ of 270 mV can be used.

Figure 10A:
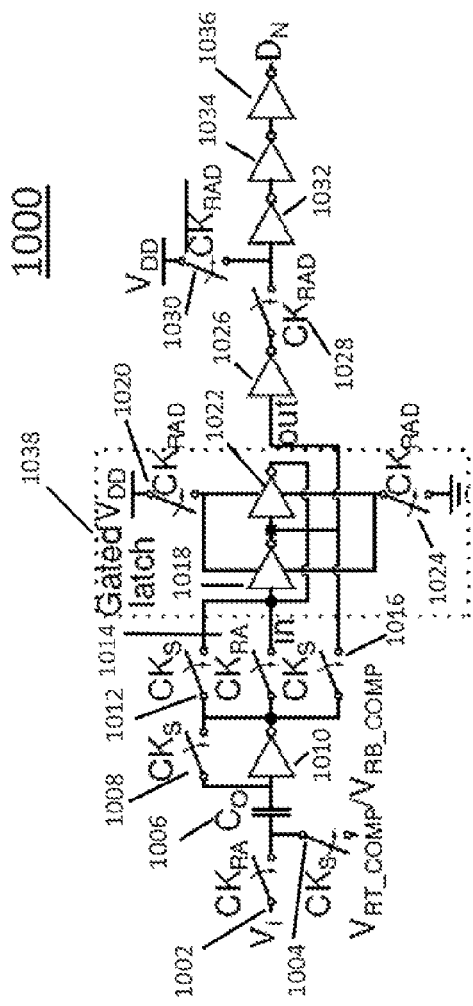
FIG. 10 is a schematic of a sub-ADC in accordance with sonic embodiments.

Turning to FIG. 10a, an example of a sub-ADC 1000 that can be used as sub-ADC 348 of FIG. 3 in accordance with some embodiments is shown. As illustrated, sub-ADC 1000 can include switches 1002, 1004, 1008, 1012, 1014, 1016, 1020, 1024, and 1028, capacitor 1006, and inverters 1010, 1018, 1022, 1026, 1032, 1034, and 1036. Any suitable switches, capacitor, and inverters can be used in some embodiments. For example, switches 1002, 1004, 1008, 1012, 1014, 1016, 1020, 1024, and 1028 can be implemented using MOS transistors or transmission gates e.g., PMOS and NMOS transistors in parallel) in some embodiments.

As shown, switches 1020 and 1024 and inverters 1018 and 1022 can be configured to form a gated latch 1038 in some embodiments.

As also shown, the bottom of switch 1004 can be fed by a voltage $V_{RT\_COMP}/V_{RB\_COMP}$, where $V_{RT\_COMP=VCM}+V_{REF}/4$ and $V_{RB\_COMP}=V_{CM}-V_{REF}/4$.

Figure 10B:
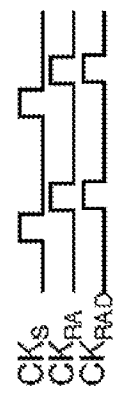

As shown in FIG. 10b, the switches in comparator 1000 can open and close based on clock signals $CK_S$ and $CK_{RA}$ (as described above) and clock signal $CK_{RAD}$. $CK_{RAD}$ is a delayed version of $CK_{RA}$, and, as shown in FIG. 10b, the delay of this signal can be very small compared to the width of its pulse. For example, in some embodiments, the delay can be around 5% of the pulse width of $CK_{RA}$ or any other suitable delay.

Figure 11A:
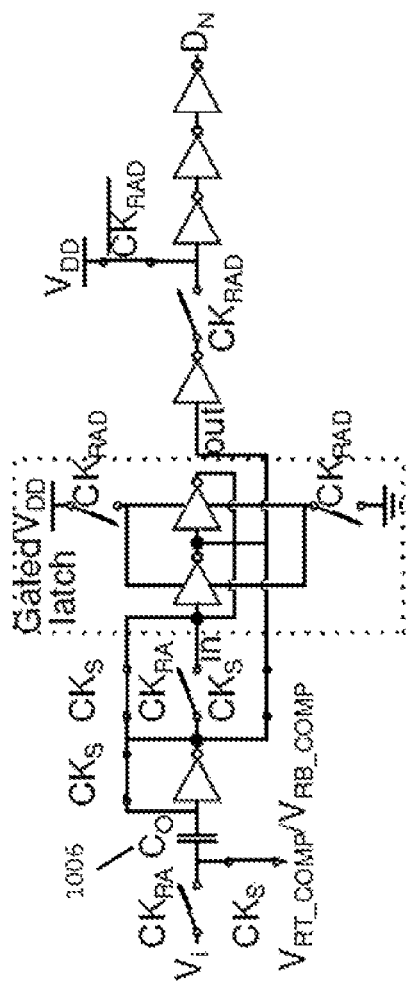
FIGS. 11a-11c are schematics showing configurations of switches of the circuit of FIG. 10 in accordance with some embodiments.
Figure 11B:
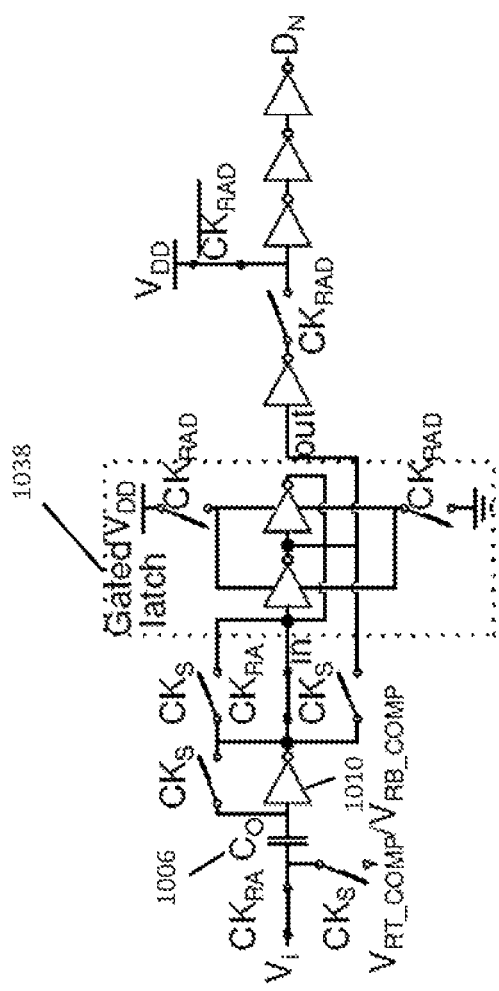
Figure 11C:
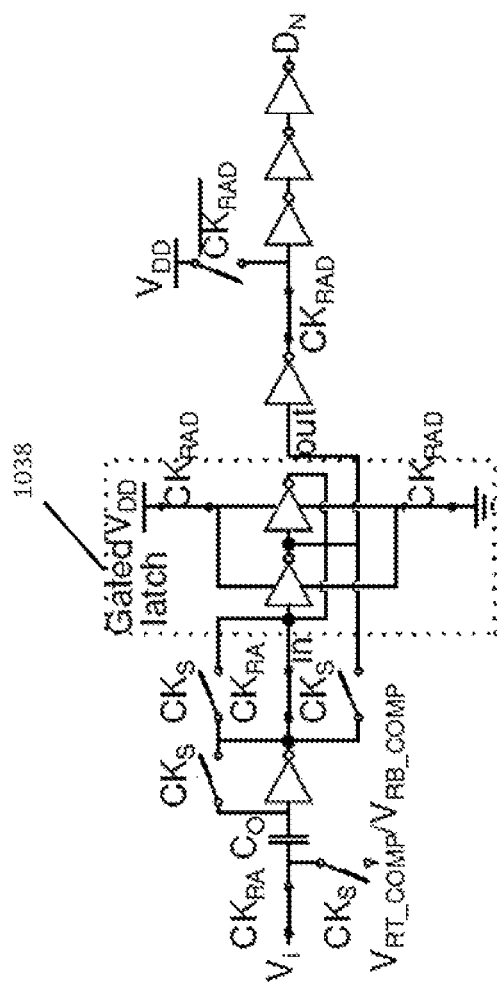

FIGS. 11a-11c show the configuration of the switches during HIGH levels of clock signals $CK_S$, $CK_{RA}$, and $CK_{RAD}$, respectively.

As with comparator 800, in some embodiments, an offset cancellation technique for the first inverter 1010 can be used. As shown in FIG. 11a, the offset of the first inverter 1010 is sampled onto capacitor $C_O$ 1006 when clock signal $CK_S$ is HIGH.

As shown in FIG. 11b, when clock signal $CK_{RA}$ goes HIGH, the input to the sub-ADC, $V_i$, is applied to capacitor $C_O$ 1006 and the output of the first inverter 1010 is connected to the input of latch 1038.

After the latch input settles for a short time, as shown in FIG. 11c, $CK_{RAD}$, a delayed version of $CK_{RA}$, becomes HIGH and latch 1038 starts regenerating to produce a digital output bit.

In accordance with some embodiments, the gain provided by the first inverter prevents the dynamic latch from being the dominant offset contributing source. Thus, by performing offset calibration for the first inverter stage, the dynamic latch can be designed much smaller in area without contributing much to the comparator input referred offset. As a result, more offset in the signal path can be tolerated.

Figure 12:
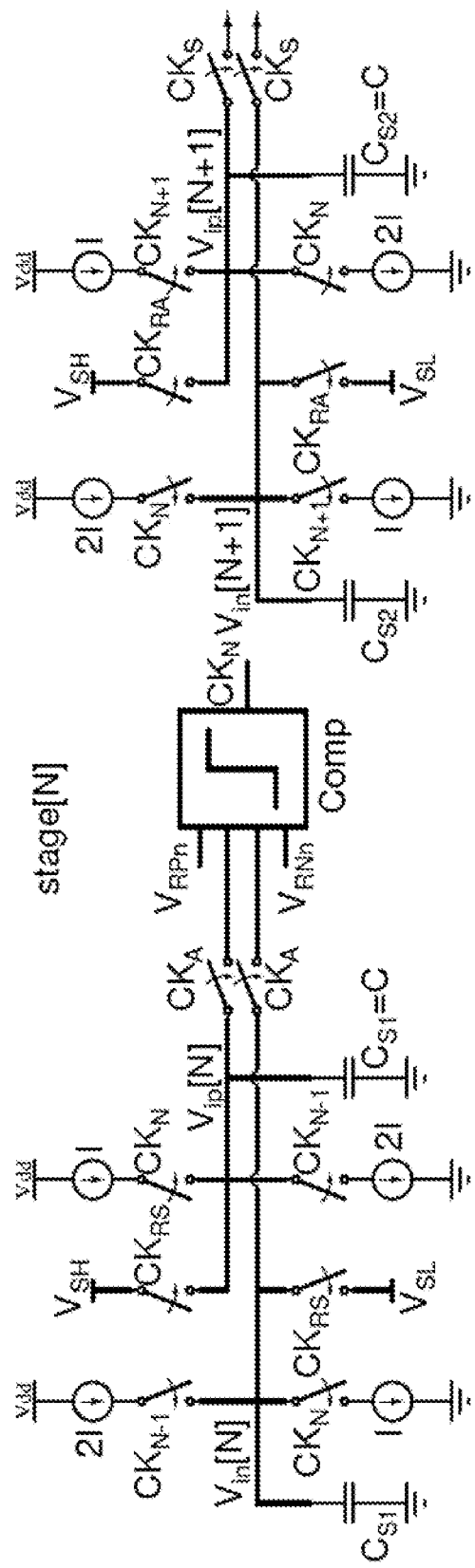
FIG. 12 is a schematic of a differential CCP residue amplifier in accordance with some embodiments.

A differential CCP residue amplifier circuit 1200 that can be used in accordance with some embodiments is illustrated in FIG. 12. In some embodiments, this circuit can operate with the same clocking scheme as described above for the single-ended implementation of FIG. 3. During the reset phases, the capacitors in the positive and negative half circuit are reset to a high initial voltage $V_{SH}$ and a low initial voltage $V_{SL}$, respectively. In this way, the capacitors in the positive and negative half circuit only need to, respectively, discharge and charge during the sampling/amplifying phases. In some embodiments, the comparator circuit can be implemented using a differential difference topology.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for implementing a residue amplifier comprising:
   a first capacitor configured to be charged to an input voltage level and that discharges from the input voltage level to a reference voltage level;
   a comparator having a first input coupled to the first capacitor, a second input coupled to a reference voltage source, and an output that indicates when the charge on the first capacitor is above the reference voltage level; and
   a second capacitor configured to be charged to an output voltage based on the output of the comparator,
   wherein the first capacitor discharges at a time based on the output of the comparator.

2. The circuit of claim 1, wherein the first capacitor is part of one stage of a multi-stage device and the second capacitor is part of a subsequent, adjacent stage of the multi-stage device.

3. The circuit of claim 2, wherein the multi-stage device is a pipelined analog-to-digital converter.

4. The circuit of claim 1, wherein the first capacitor is discharged for the same amount of time that the second capacitor is charged.

5. The circuit of claim 4, wherein the first capacitor is discharged simultaneously with the charging of the second capacitor.

6. A circuit for implementing a residue amplifier comprising:
   a first capacitor configured to be charged to an input voltage level and that discharges from the input voltage level to a reference voltage level;

a comparator having a first input coupled to the first capacitor, a second input coupled to a reference voltage source, and an output that indicates when the charge on the first capacitor is above the reference voltage level;

a second capacitor configured to be charged to an output voltage based on the output of the comparator;

a first current source coupled to the first capacitor and that discharges the first capacitor; and a first switch that couples the first capacitor to the first current source and that stops the first capacitor from being discharged by the first current source based on the output of the comparator.

7. The circuit of claim 6, wherein the first current source draws the same current when discharging the first capacitor and when not discharging the first capacitor.

8. The circuit of claim 6, further comprising:
a second current source coupled to the second capacitor and that charges the second capacitor; and
a second switch that couples the second capacitor to the second current source and that stops the second capacitor from being charged by the second current source based on the output of the comparator.

9. The circuit of claim 8, wherein the first switch and the second switch are each one of a MOS transistor and a transmission gate.

10. The circuit of claim 8, further comprising a third current source and a third capacitor, wherein the third current source charges the third capacitor based on the output of the comparator.

11. A circuit for implementing a residue amplifier comprising:
a first capacitor configured to be charged to an input voltage level and that discharges from the input voltage level to a reference voltage level;
a comparator having a first input coupled to the first capacitor, a second input coupled to a reference voltage source, and an output that indicates when the charge on the first capacitor is above the reference voltage level;
a second capacitor configured to be charged to an output voltage based on the output of the comparator;
a first resistor coupled to the first capacitor and that discharges the first capacitor; and
a first switch that couples the first capacitor to the first resistor and that stops the first capacitor from being discharged by the first resistor based on the output of the comparator.

12. The circuit of claim 11, further comprising:
a second resistor coupled to the second capacitor and that charges the second capacitor; and
a second switch that couples the second capacitor to the second resistor and that stops the second capacitor from being charged by the second resistor based on the output of the comparator.

13. A method for implementing a residue amplifier comprising:
charging a first capacitor to an input voltage level and then discharging the first capacitor from the input voltage level to a reference voltage level;
comparing the voltage level on the first capacitor to the voltage level from a reference voltage source, and producing an indication when the voltage level on the first capacitor is above the voltage level from the reference voltage source; and
charging a second capacitor to an output voltage based on the indication,
wherein the first capacitor discharges at a time based on the output of the comparator.

14. The method of claim 13, wherein the first capacitor is part of one stage of a multi-stage device and the second capacitor is part of a subsequent, adjacent stage of the multi-stage device.

15. The method of claim 14, wherein the multi-stage device is a pipelined analog-to-digital converter.

16. The method of claim 13, wherein the first capacitor is discharged for the same amount of time that the second capacitor is charged.

17. The method of claim 16, wherein the first capacitor is discharged simultaneously with the charging of the second capacitor.

18. A method for implementing a residue amplifier comprising:
charging a first capacitor to an input voltage level and then discharging the first capacitor from the input voltage level to a reference voltage level;
comparing the voltage level on the first capacitor to the voltage level from a reference voltage source, and producing an indication when the voltage level on the first capacitor is above the voltage level from the reference voltage source; and
charging a second capacitor to an output voltage based on the indication;
discharging the first capacitor using a first current source; and
stopping the first capacitor from being discharged by the first current source based on the indication using a first switch.

19. The method of claim 18, wherein the first current source draws the same current when discharging the first capacitor and when not discharging the first capacitor.

20. The method of claim 18, further comprising:
charging the second capacitor using a second current source; and
stopping the second capacitor from being charged by the second current source based on the indication using a second switch.

21. The circuit of claim 20, wherein the first switch and the second switch are each one of a MOS transistor and a transmission gate.

22. The method of claim 20, further comprising charging a third capacitor using a third current source based on the indication.

23. A method for implementing a residue amplifier comprising:
charging a first capacitor to an input voltage level and then discharging the first capacitor from the input voltage level to a reference voltage level;
comparing the voltage level on the first capacitor to the voltage level from a reference voltage source, and producing an indication when the voltage level on the first capacitor is above the voltage level from the reference voltage source;
charging a second capacitor to an output voltage based on the indication;
discharging the first capacitor using a first resistor; and
stopping the first capacitor from being discharged by the first resistor based on the indication using a first switch.

24. The method of claim 23, further comprising:
charging the second capacitor using a second resistor; and
stopping the second capacitor from being charged by the second resistor based on the indication using a second switch.

* * * * *